US006946861B2

United States Patent
Lee et al.

(10) Patent No.: US 6,946,861 B2
(45) Date of Patent: Sep. 20, 2005

(54) CIRCUIT BOARD TESTING JIG

(75) Inventors: Chung-Shan Lee, Taoyuan (TW);
Yuan-Chiang Li, Taoyuan (TW);
Chih-Kai Hsu, Taoyuan (TW)

(73) Assignee: ASUSTeK Computer Inc., Taipei (TW)

( * ) Notice: Subject to any disclaimer, the term of this patent is extended or adjusted under 35 U.S.C. 154(b) by 65 days.

(21) Appl. No.: 10/945,966

(22) Filed: Sep. 22, 2004

(65) Prior Publication Data

US 2005/0151550 A1 Jul. 14, 2005

(30) Foreign Application Priority Data

Jan. 8, 2004 (TW) .......................................... 93100483 A
Apr. 9, 2004 (CN) ................................. 200410034316 A

(51) Int. Cl.[7] ............................................... G01R 31/02
(52) U.S. Cl. ......................................................... 324/757
(58) Field of Search ............................. 324/757, 158.1, 324/527, 537, 750, 754, 755, 756, 761, 763, 764, 765

(56) References Cited

U.S. PATENT DOCUMENTS 5,654,751 A * 8/1997 Richard, III ................. 348/192
5,831,441 A * 11/1998 Motooka et al. ............ 324/754

* cited by examiner

Primary Examiner—David Zarneke
Assistant Examiner—Trung Q. Nguyen
(74) Attorney, Agent, or Firm—Birch, Stewart, Kolasch & Birch, LLP.

(57) ABSTRACT

A circuit board testing jig tests a circuit board. The jig includes a first testing unit, a second testing unit, and a carrier. The first testing unit has at least one first alignment hole. The second testing unit has at least one first alignment rod. The carrier is set between the first testing unit and the second testing unit. The carrier includes a first surface, a second surface, and at least one carrier alignment hole. The first surface of the carrier faces the first testing unit. The second surface of the carrier carries the circuit board and faces the second testing unit. The carrier alignment hole passes through the first surface of the carrier to the second surface of the carrier. The edge of carrier alignment hole on the second surface has a guiding angle. The first alignment rod passes through the carrier alignment hole and then inserts into the first alignment hole.

10 Claims, 6 Drawing Sheets

CIRCUIT BOARD TESTING JIG

This Nonprovisional application claims priority under 35 U.S.C. § 119(a) on Patent Application No(s). 093100483 filed in Taiwan, Republic of China on Jan. 8, 2004, the entire contents of which are hereby incorporated by reference.

BACKGROUND OF THE INVENTION

1. Field of Invention

The invention relates to a testing jig and, in particular, to a circuit board testing jig, which assembles and aligns the circuit board easily.

2. Related Art

For maintaining the fabrication quality of a circuit board, an electrical test for the circuit board or components of the circuit board is usually performed after the circuit board is manufactured.

FIG. 1 is a schematic view showing a conventional circuit board testing equipment. The conventional circuit board testing equipment comprises a circuit board testing machine 1 and a circuit board testing jig 2 used in the circuit board testing machine 1.

Referring to FIG. 1, the circuit board testing jig 2 comprises a first testing unit 21, a second testing unit 22 and a carrier 23, wherein the first testing unit 21 is also called a bottom fixture and the second testing unit 22 is also called a top fixture.

The second testing unit 22 is connected with a pressure plate 11 of the circuit board testing machine 1. When the pressure plate 11 of the circuit board testing machine 1 presses downwardly, the second testing unit 22 is forced and moves along the direction of the applied force. Thus, the second testing unit 22, the carrier 23 and the first testing unit 21 are assembled, and a circuit board 3 positioned on the carrier 23 can be then tested.

Referring to FIG. 2, the first testing unit 21 includes a plurality of probes 211 and connectors 212. The probes 211 protrude from the first testing unit 21 and correspond to the pins of the electrical component 31 of the circuit board 3. Besides, the first testing unit 21 further includes at lease one first alignment hole 213, a plurality of elastic component 214 and at least one second alignment hole 215.

The second testing unit 22 is set above the first testing unit 21 and is composed of a plurality of rods 221, an alignment plate 222 and a detecting plate 223. The rods 221 are arranged between the alignment plate 222 and the detecting plate 223, so that the alignment plate 222 and the detecting plate 223 are parallel to one another. The alignment plate 222 is connected with the pressure plate 11. The detecting plate 223 includes at least one first alignment rod 224, a plurality of probes 225 corresponding to pins of the electrical component 31 of the circuit board 3 and a connector 226.

The carrier 23 is set between the first testing unit 21 and the second testing unit 22, and one side of the carrier 23 carriers the circuit board 3. The carrier 23 includes at least one carrier alignment hole 231 corresponding to the first alignment hole 213 of the first testing unit 21 and holes 233 corresponding to pins of the electrical component 31 of the circuit board 3. Besides, the opposite side of the carrier 23 includes at lease one second alignment rod 232.

Referring to FIGS. 1, 2 and 3, when testing the circuit board 3, firstly the second testing unit 22 is fixed to the pressure plate 11 of the circuit board testing machine 1. The first testing unit 21 is fixed on the platform 12 of the circuit board testing machine 1. Then, the circuit board 3 is positioned on the carrier 23.

The second alignment rod 232 of the carrier 23 is then inserted into the second alignment hole 215 of the first testing unit 21. In this case, the carrier alignment hole 231 is provided corresponding to the first alignment hole 213 of the first testing unit 21. After that, a control unit is used to control the action of the pressure plate 11, so that the first alignment rod 224 passes through the carrier alignment hole 231 and inserts into the first alignment hole 213 of the first testing unit 21. The probes 225 of the second testing unit 22 and the probes 211 of the first testing unit 21 are connected to pins of the electrical component 31 of the circuit board 3. Every connector of the circuit board testing jig 2 is electrically coupled to the circuit board testing machine 1, so as to use the circuit board testing machine 1 to test the electrical characters of the circuit board 3.

Referring to FIG. 4, owing to the diameter of the carrier alignment hole 231 is larger than the diameter of the first alignment hole 213 of the first testing unit 21, the first alignment rod 224 of the second testing unit 22 could not be facilely aligned to insert into the first alignment hole 213 after it passes through the carrier alignment hole 231. Accordingly, the operator should spend more time and be more careful to align the first alignment rods 224 and to make them pass through the carrier 23 and insert into the corresponding first alignment holes 213 of the first testing unit 21. In other words, the conventional circuit board testing jig has some drawbacks as described below:

1. Difficult alignment: It is hard to align every first alignment rod 224 of the second testing unit 22 and to directly insert it into the corresponding first alignment hole 213 of the first testing unit 21. Thus, the operator may spend more time to perform this testing process.
2. Jig is easily damaged: Referring to FIGS. 4 and 5, the pressure plate 11 of the circuit board testing machine 1 applies a force to the circuit board testing jig 2. If the first alignment rod 224 of the second testing unit 22 is not insert into the first alignment hole 213 of the first testing unit 21 and is against the first testing unit 21, the second testing unit 22 would be damaged when the pressure plate 11 moves toward the second testing unit 22. Since the first alignment rods 224 of the second testing unit 22 directly press the first testing unit 21, the second testing unit 22 made by acrylic or glass would be broken, resulting in the damage of the circuit board testing jig 2.

It is therefore an important subjective of the invention to provide a circuit board testing jig that can solve the above-mentioned problems.

SUMMARY OF THE INVENTION

In view of the foregoing, this invention is to provide a circuit board testing jig, which can assemble and aligns a circuit board easily.

To achieve this, the circuit board testing jig of the invention for testing a circuit board comprises a first testing unit, a second testing unit and a carrier. The first testing unit has at least one first alignment hole. The second testing unit has at least one first alignment rod. The carrier is set between the first testing unit and the second testing unit, and has a first surface, a second surface and at least one carrier alignment hole. The first surface faces the first testing unit, and the second surface carriers the circuit board and faces the second testing unit. The carrier alignment hole is set through the first surface and the second surface, and the edge of the carrier alignment hole adjacent to the second surface is formed with a guiding angle. The first alignment rod passes through the carrier alignment hole and inserts into the first alignment hole when testing the circuit board.

As mentioned above, regarding to the circuit board testing jig of the invention, the edge of the carrier alignment hole adjacent to the second surface is formed with a guiding angle. Therefore, the invention can quickly and easily setup the circuit board testing jig to save setup time and to protect the testing jig.

BRIEF DESCRIPTION OF THE DRAWINGS

The invention will become more fully understood from the detailed description given here in below illustration only, and thus is not limitative of the present invention, and wherein.

DETAILED DESCRIPTION OF THE INVENTION

The circuit board testing jig according to preferred embodiments of the invention will be described herein below with reference to the accompanying drawings, wherein the same reference numbers refer to the same elements.

Figure 1:
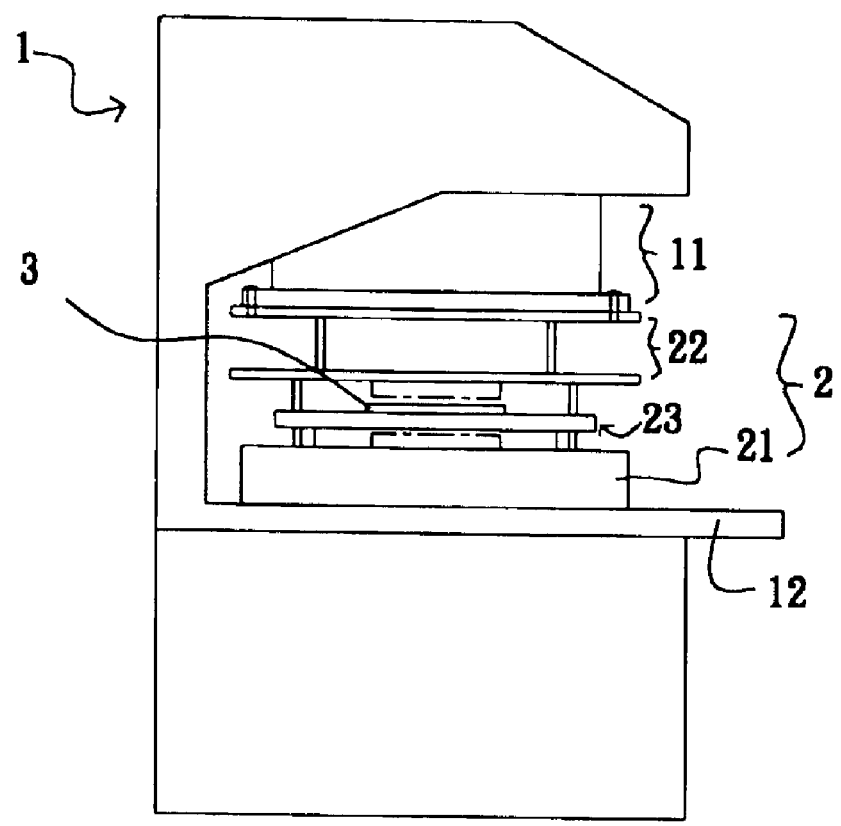
FIG. 1 is a schematic view showing the conventional circuit board testing machine and jig.
Figure 2:
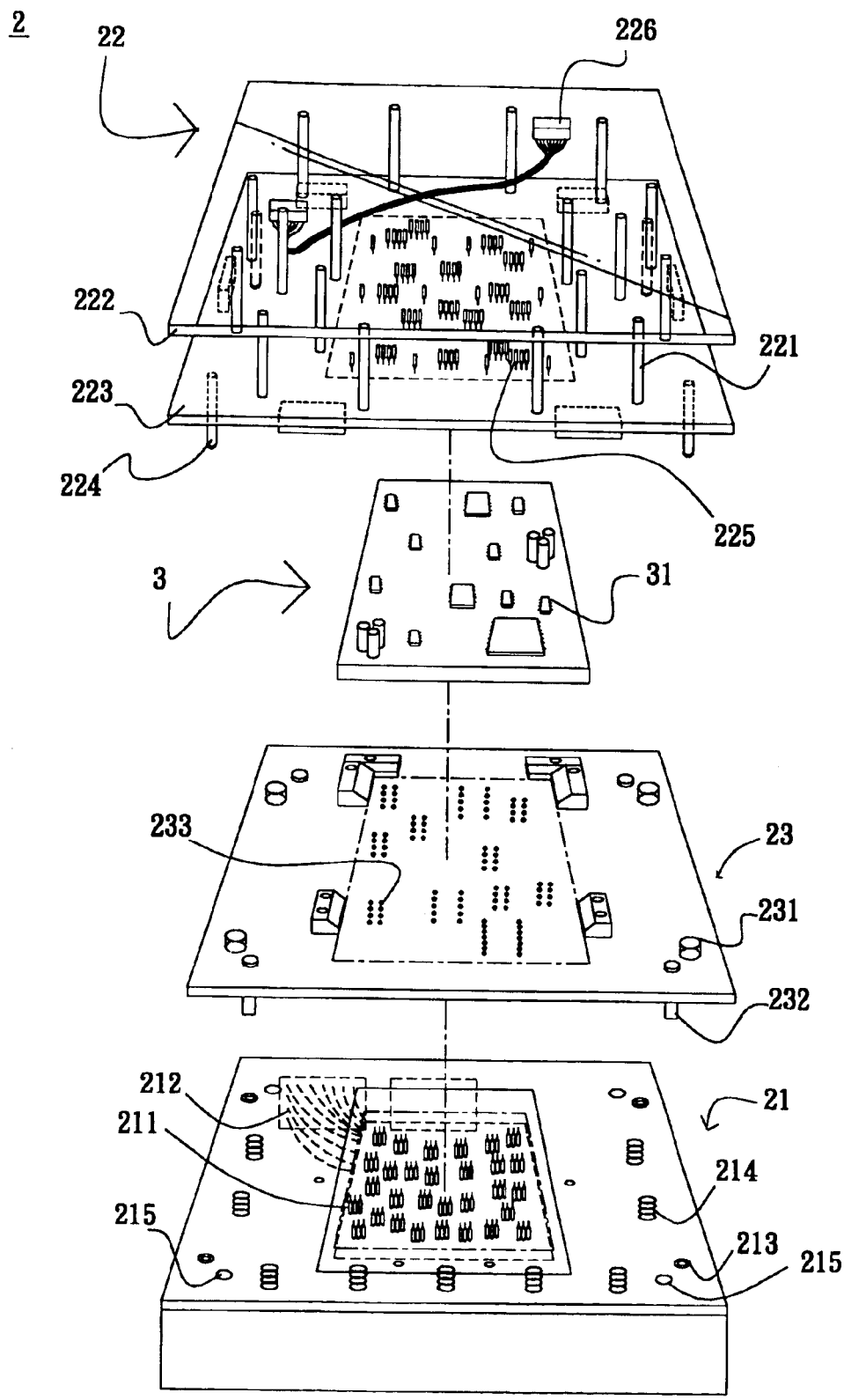
FIG. 2 is an exploded schematic view showing the conventional circuit board testing jig.
Figure 3:
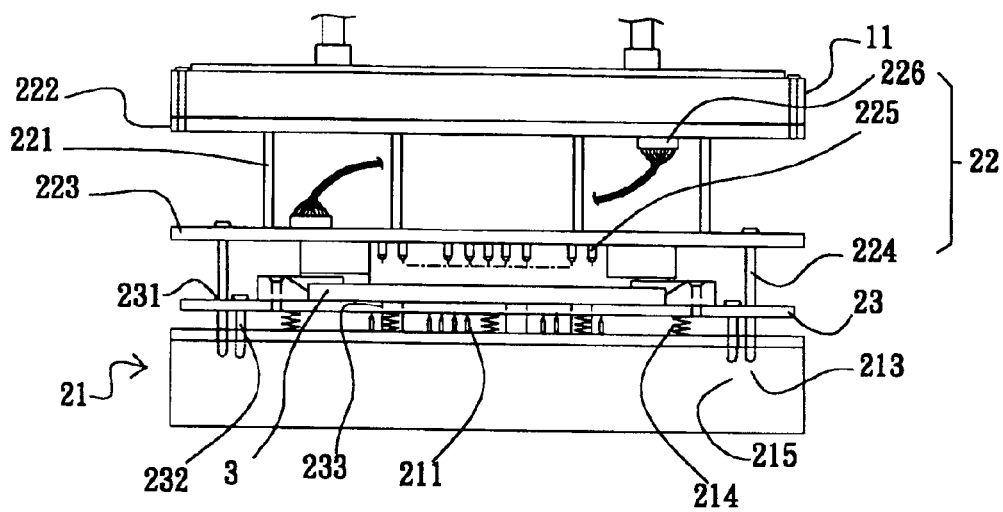
FIG. 3 is a combination schematic view showing the conventional circuit board testing jig.
Figure 4:
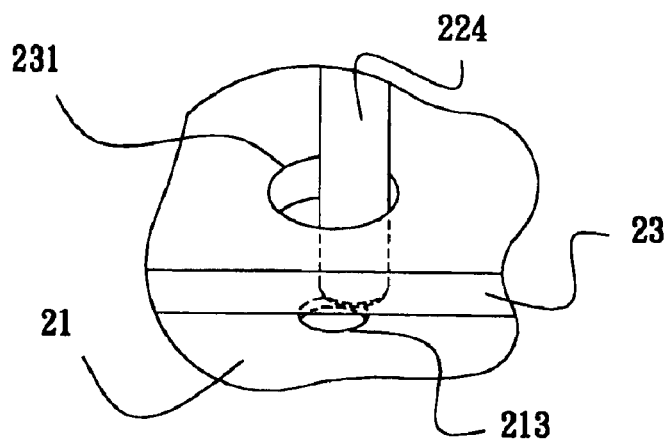
FIG. 4 is a partially enlarged schematic view showing the conventional circuit board testing jig.
Figure 5:
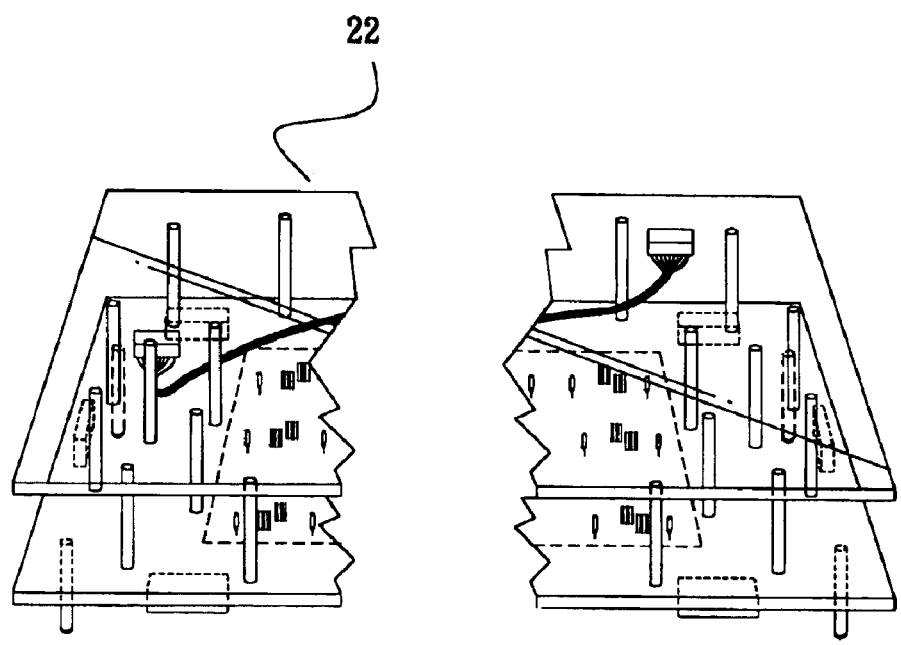
FIG. 5 is a schematic view showing the conventional broken circuit board testing jig when apply a force to it.
Figure 6:
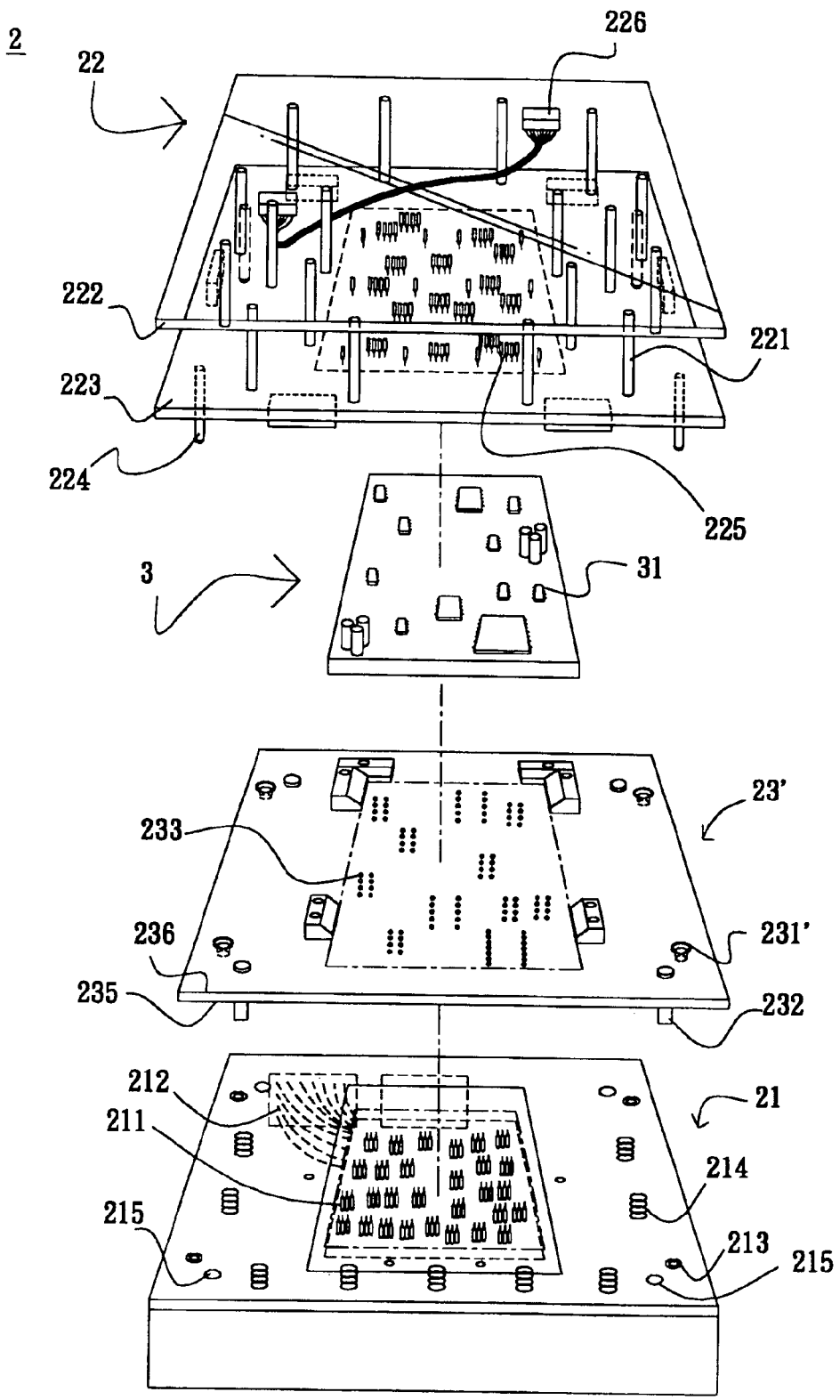
FIG. 6 is an exploded schematic view showing a circuit board testing jig according to a preferred embodiment of the invention.

Referring to FIG. 6, the circuit board testing jig 2 comprises a first testing unit 21, a second testing unit 22 and a carrier 23'. In the embodiment, the first testing unit 21 and second testing unit 22 are the same as the previous-mentioned first testing unit 21 and the second testing unit 22 (as shown in FIG. 2).

Referring to FIG. 6, the carrier 23' has a first surface 235 and a second surface 236.

Figure 7:
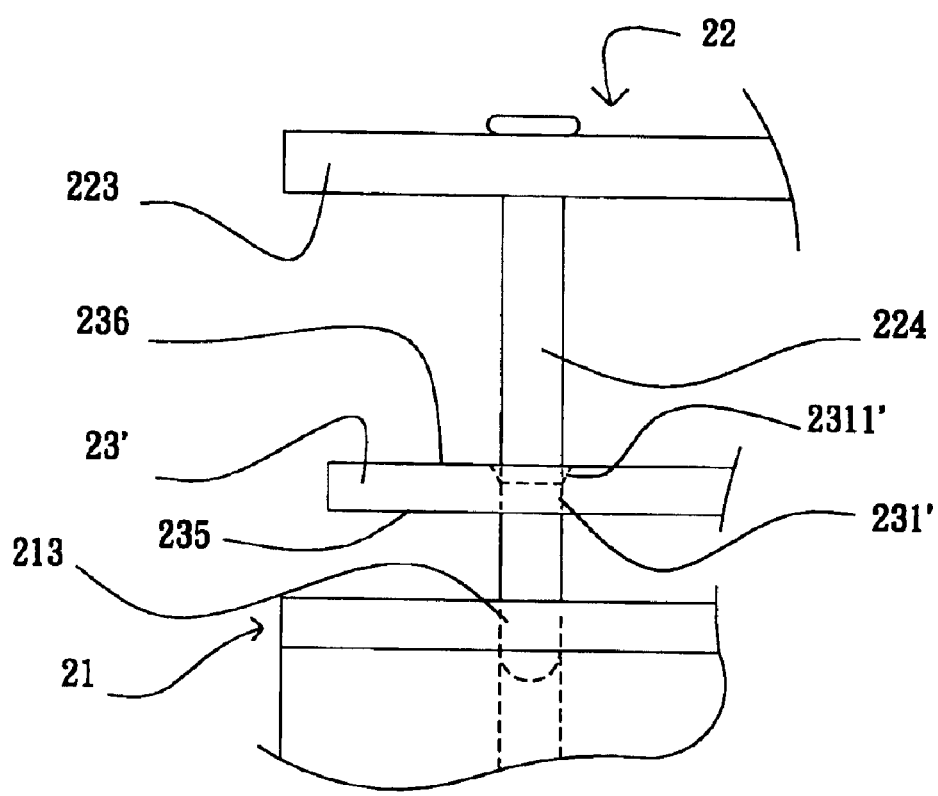
FIG. 7 is a partially enlarged schematic view showing a circuit board testing jig according to a preferred embodiment of the invention.

The carrier 23' has at least one carrier alignment hole 231' corresponding to the first alignment hole 213 of the first testing unit 21. The carrier alignment hole 231' is set through the first surface 235 and the second surface 236. The diameter of the section of the carrier alignment hole 231' adjacent to the second surface 236 is larger than the diameter of the section of the carrier alignment hole 231' adjacent to the first surface 235. The diameter of the carrier alignment hole 231' is gradually decreased from the second surface 236 to the first surface 235. In details, the diameter of the carrier alignment hole 231' is gradually decreased from the section parallel to and adjacent to the second surface 236 to the section parallel to and adjacent to the first surface 235. The edge of the carrier alignment hole 231' adjacent to the second surface 236 is formed with a guiding angle 2311' (as shown in FIG. 7). The inner wall of the carrier alignment hole 231' is a smooth surface.

Referring to FIG. 7, the diameter of the section of the carrier alignment hole 231' adjacent to the second surface 236 is larger than the diameter of the section of the carrier alignment hole 231' adjacent to the first surface 235, the edge of the carrier alignment hole 231' adjacent to the second surface 236 is formed with a guiding angle 2311', and the diameter of the section of the carrier alignment hole 231' adjacent to the first surface 235 is about the diameter of the periphery of the first alignment rod 224. Therefore, the first alignment rod 224 of the second test unit 22 is guided to pass through the carrier 23' and to insert into the first alignment hole 213 of the first testing unit 21. In this embodiment, the profile of the carrier alignment hole is a trumpet-like shape, trumpet-like shape, or funnel-like shape. That is, the section of the carrier alignment hole 231' perpendicular to the first surface 235 and the second surface 236 can be an arc-like shape, trumpet-like shape, or funnel-like shape.

In summary, since the edge of the carrier alignment hole 231' adjacent to the second surface 236 is formed with a guiding angle 2311', and the diameter of the section of the carrier alignment hole 231' adjacent to the second surface 236 is larger than the diameter of the section of the carrier alignment hole 231' adjacent to the first surface 235, the circuit board testing jig of the invention can be easily assembled and can avoid being damaged when testing the circuit board.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A circuit board testing jig for testing a circuit board, comprising:

a first testing unit, which has at least one first alignment hole;

a second testing unit, which has at least one first alignment rod; and a carrier, which is set between the first testing unit and the second testing unit, and has a first surface, a second surface and at least one carrier alignment hole, wherein the first surface faces the first testing unit, the second surface carriers the circuit board and faces the second testing unit, the carrier alignment hole is set through the first surface and the second surface, the edge of the carrier alignment hole adjacent to the second surface is formed with a guiding angle, and the first alignment rod passes through the carrier alignment hole and inserts into the first alignment hole when testing the circuit board.

2. The circuit board testing jig of claim 1, wherein the first testing unit further comprises at least one second alignment hole, the carrier further comprises at least one second alignment rod, the second alignment rod is positioned into the second alignment hole, and the distance between the carrier and the first testing unit is decreased when providing a pressure to the carrier.

3. The circuit board testing jig of claim 1, wherein the diameter of the carrier alignment hole is gradually decreased from the second surface to the first surface.

4. The circuit board testing jig of claim 1, wherein the profile of the carrier alignment hole is a trumpet-like shape.

5. The circuit board testing jig of claim 1, wherein the profile of the carrier alignment hole is a funnel-like shape.

6. The circuit board testing jig of claim 1, wherein the profile of the carrier alignment hole is an arc-like shape.

7. The circuit board testing jig of claim 1, wherein the inner diameter of the carrier alignment hole adjacent to the first surface is about the diameter of the periphery of the first alignment rod.

8. The circuit board testing jig of claim 1, wherein the second testing unit further comprises an alignment plate and a detecting plate.

9. The circuit board testing jig of claim 1, wherein the first testing unit comprises a plurality of testing probes.

10. The circuit board testing jig of claim 1, wherein the second testing unit comprises a plurality of testing probes.

* * * * *